United States Patent [19]

Kohler

[11] 4,445,093
[45] Apr. 24, 1984

[54] PRESS CYCLE MONITOR

[75] Inventor: Robert D. Kohler, Temperance, Mich.

[73] Assignee: Toledo Transducers, Inc., Toledo, Ohio

[21] Appl. No.: 302,147

[22] Filed: Sep. 14, 1981

Related U.S. Application Data

[63] Continuation of Ser. No. 79,048, Sep. 26, 1979, abandoned.

[51] Int. Cl.³ ........................................... H03K 5/153
[52] U.S. Cl. .................................. 328/151; 307/351; 307/353; 307/359; 307/308; 324/103 P; 328/115
[58] Field of Search ............... 307/351, 352, 353, 359, 307/308; 328/114, 132, 150, 151, 115; 324/103 P

[56] References Cited

U.S. PATENT DOCUMENTS

| | | | |
|---|---|---|---|
| 3,740,654 | 6/1973 | Rossbach et al. | 307/353 X |
| 3,842,345 | 10/1974 | Padgitt et al. | 324/103 P |
| 3,882,489 | 5/1975 | Guggolz | 307/351 |
| 4,001,604 | 1/1977 | Parks et al. | 307/353 |
| 4,053,799 | 10/1977 | Minami | 307/353 |

Primary Examiner—John Zazworsky
Attorney, Agent, or Firm—Emch, Schaffer & Schaub Co.

[57] ABSTRACT

An improved cycle monitor is disclosed for measuring the peak force exerted by a machine in each of a series of operating cycles. The force exerted by the machine is measured and applied to a peak detector which stores a signal proportional to the highest force exerted by the machine. The peak detector is automatically reset at the beginning of each cycle and the peak detector output is transferred to and stored in a suitable utilizing device, such as a display and alarm circuit, after the highest pressure occurs in each cycle.

12 Claims, 6 Drawing Figures

PRESS CYCLE MONITOR

This application is a continuation of application Ser. No. 79,048, filed Sept. 26, 1979, abandoned.

BACKGROUND OF THE INVENTION

This invention relates to measuring and testing and more particularly to an improved press cycle monitor for measuring the peak forces exerted in repetitive cycles of a stamping press, a drill press or a similar production machine.

Many production machines are operated in a repetitive or cyclic manner for performing operations on successive workpieces. In stamping presses, for example, a piece of stock material is positioned between two open dies and the dies are then closed and a high force is exerted therebetween to cut and shape the stock material into a desired configuration. After shaping, the dies are opened, the shaped workpiece is ejected from the dies and additional stock material is advanced and the cycle is repeated. Under normal production, the machine operates automatically and does not require the services of an operator. However, problems may occur at any time requiring the immediate attention of an operator. For example, stock may fail to feed into the dies, or a stamped part may fail to eject from the dies after they are opened, or the dies may jam or stick due to a malfunction such as a misalignment. If the difficulty is not promptly attended to, a large number of defective workpieces may be produced or the press may be damaged. Therefore, it is desirable to have a monitor to indicate when a press or other type of cyclic manufacturing machine is not operating in a desired manner.

It is known that the operation of many repetitive manufacturing machines may be monitored by monitoring the pressure exerted by the machine during each successive cycle. U.S. Pat. No. 3,257,652, for example, discloses a monitor for a hydraulically operated stamping press in which the hydraulic pressure during each cycle is measured and displayed as a pressure-time curve on an oscilloscope. The pressure versus time curve for a normal operating cycle is marked on a mask which is positioned over the oscilloscope. If the curve for any cycle deviates from the curve marked on the mask, an operator may take corrective measures. However, this system requires designing a separate mask for each different operating condition. If the dies are changed to manufacture a different product, the mask also must be changed since the pressure-time curve will change. Or, if the speed of the press is changed, a new mask must be made since the pressure-time curve will be compressed if the speed of the press in increased or will be expanded if the speed of the press is decreased.

There has been difficulty in the past in adapting press monitors for operating automatically with different press cycle times and also for operating for measuring and indicating the highest peak of the press pressure curve where the pressure curve may have several peaks in a cycle. For example, as a press is actuated during a cycle, there may be a single pressure curve or the pressure curve may oscillate and may have multiple peaks. The highest pressure peak may be any one of the multiple peaks. If several lower level peaks follow the highest peak, there is a tendency for the press monitor to read and indicate the last or most recent peak even though this is not indicative of the highest press pressure. Problems also may occur with the press monitor sensing and indicating low level noise or other spurious signals. If the press cycle monitor is adapted to provide an alarm in the event of a low signal, the false reading may cause an alarm condition and the press may be shut down even though the press is operating correctly.

SUMMARY OF THE INVENTION

According to the present invention, an improved cycle monitor is provided for use on production presses and similar production machines having a repetitive cycle. A sensor, such as an array of load cell train gauges, is mounted on the press for measuring the pressure exerted by the press on a workpiece. When the signal from the sensor first exceeds a threshold level, such as 10% of the maximum operating pressure of the press, a peak signal detector is reset. The peak press pressure is measured during the completion of a cycle and the sensed pressure is applied to a digital display unit and may be used for comparison with alarm limits to determine whether or not the press is operating within a desired range. The sensed pressure is maintained on the display until the lapse of a predetermined delay or time. The time delay prevents the display from updating and indicating a premature, low alarm readout. Also, the delay prevents resetting the peak detector by a lower level signal immediately following the highest peak signal which will result in an incorrect force indication.

The output from the pressure sensor is applied to a threshold detector which may, for example, be a Schmitt trigger set to change output levels when the sensor output exceeds a predetermined level, such as 10% of the maximum press load. The output of the threshold level detector is applied to a threshold delay circuit which is connected to immediately reset the peak detector and also to transfer the output of the peak detector to a display and alarm circuit after a time delay. The threshold delay circuit is set to measure either a relatively long time interval after the sensor output first crosses the threshold level or to measure a shorter time interval after the sensor output finally drops below the threshold level during a press cycle. After the lapse of the measured time delay, the output of the peak detector is transferred to the display and alarm circuit. The peak detector is reset in the next cycle when the threshold level is first crossed.

Accordingly, it is an object of the invention to provide an improved monitor for measuring the load on a press or similar production machine having a repetitive cycle which will operate automatically over a wide range of the cycle times.

Another object of the invention is to provide an improved press cycle monitor which measures the load on a press or similar production machine in response only to the output of a single sensor which measures the load on the press.

Other objects and advantages of the invention will become apparent from the following detailed description, with reference being made to the accompanying drawings.

DESCRIPTION OF THE PREFERRED EMBODIMENTS

Figure 1:
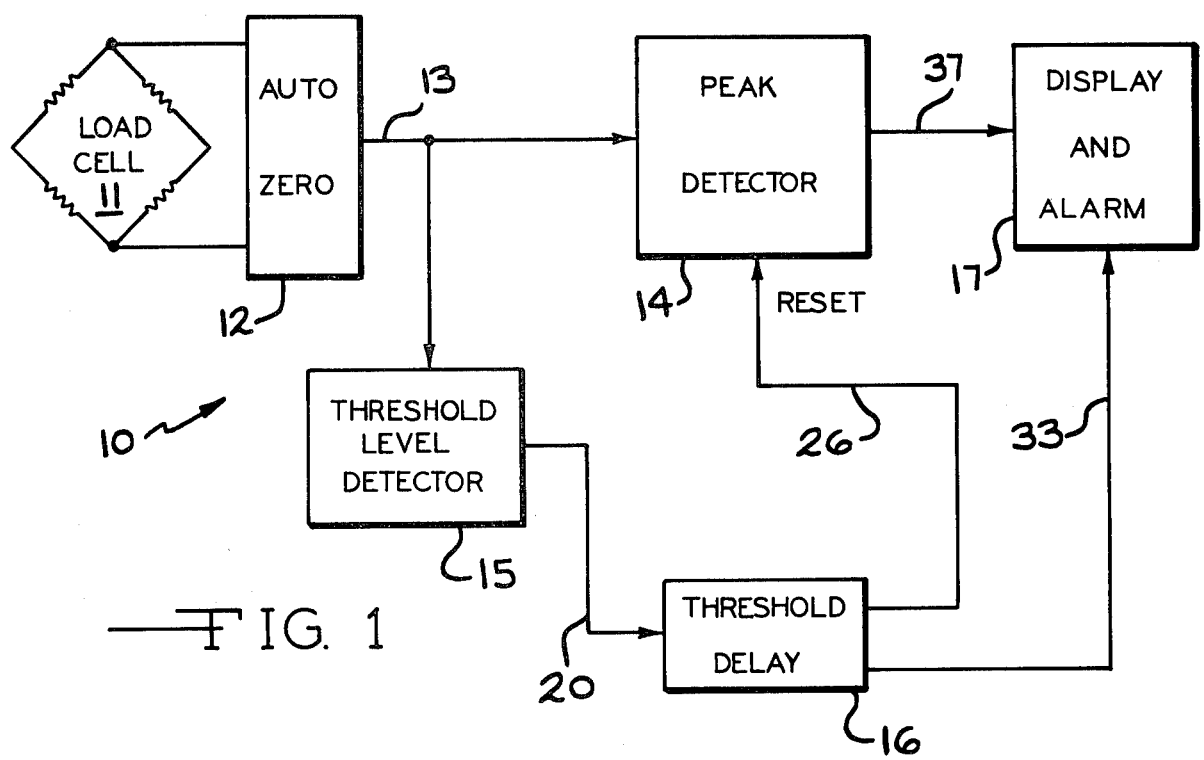
FIG. 1 is a schematic block diagram of a press cycle monitor constructed in accordance with a preferred embodiment of the invention.

Turning now to the drawings and particularly to FIG. 1, a block diagram is illustrated for a press cycle monitor 10 constructed in accordance with the present invention. The press cycle monitor 10 includes a load sensor 11, such as a strain gauge array, which is mounted on a press (not shown) or other repetitive production machines for sensing pressures exerted by the machine during each cycle of operation. The load sensor 11 generates an analog output signal which is proportional to the force exerted by the press. This output is applied to an auto-zero circuit 12. The auto-zero circuit 12 compensates the output of the load sensor 11 for any DC voltage offset or zero drift and may be of a conventional circuit, such as is disclosed in U.S. Pat. No. 3,754,126. The auto-zero circuit 12 has an output 13 which is an analog signal directly proportional to the force exerted by the press on a workpiece. The output 13 from the auto-zero circuit 12 is applied to a peak detector 14 which samples and stores the highest output signal from the load sensor 11 during each press cycle.

The output 13 from the auto-zero circuit 12 also is applied to a threshold level detector 15. The threshold level detector 15, for example, may comprise a Schmitt trigger and amplifier circuit adapted to have a first output level when the load on the press is less than a preselected threshold level and a second output level whenever the load on the press is above the threshold level. The threshold level may be set at any desired point, such as 10% of the maximum load which may be exerted by the press. The output of the threshold level detector 15 is applied to a threshold delay circuit 16 which, after a preset time delay generates an output to transfer the maximum load signal stored in the peak detector 14 to display and alarm circuit 17. The threshold level detector 15 and the threshold delay circuit 16 also clear or reset the peak detector circuit 14 to approximately the threshold level when the threshold level is first exceeded in each press cycle. The display and alarm circuit 17 includes a suitable memory for storing the output signal from the peak detector 14 and may further include an analog-to-digital converter and a digital display meter for indicating the maximum force exerted by the press. Furthermore, the press force signal may be compared with maximum and minimum permissible press load limits. If the maximum press load measured during any given cycle falls above or below the permissible range, an alarm condition is established and the press may be automatically shut down. Or, the display and alarm circuit 17 may be designed to notify an operator if the maximum measured press load falls outside of a first permissible range and within a second permissible range.

Figure 2:
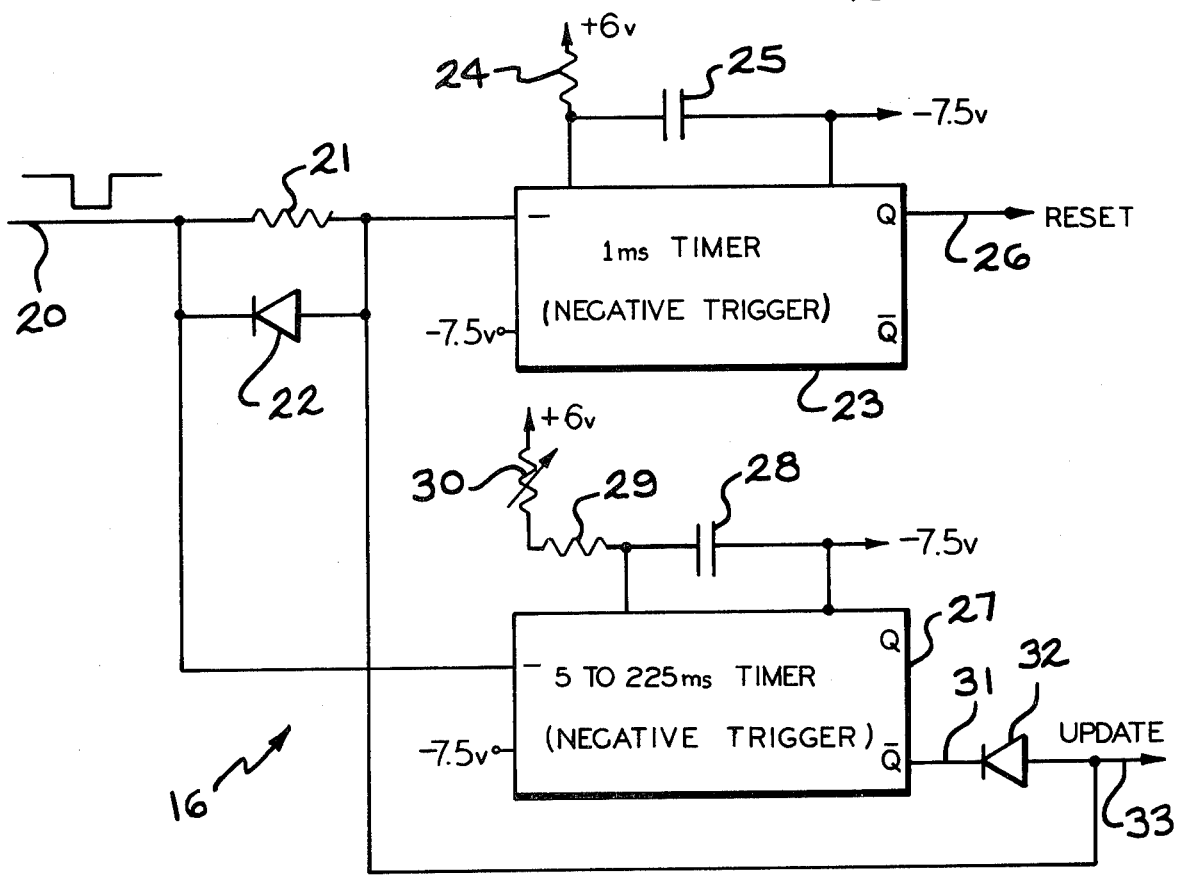
FIG. 2 is a circuit diagram of one embodiment of a threshold delay circuit for use in the press cycle monitor illustrated in FIG. 1.

Turning now to FIG. 2, one embodiment of the threshold delay circuit 16 is illustrated. The threshold level detector 15 applies an output signal on an output 20 which has two levels, depending upon the load or force exerted by the press and measured by the load sensor 11. For the following illustrated embodiment, the threshold level detector output 20 will be described as having a high logic level of $+6$ volts when the output of the load sensor 11 is below the threshold level and of $-7.5$ volts when the output of the load sensor 11 exceeds the threshold level. The threshold level detector output 20 is applied through a parallel resistor 21 and diode 22 to trigger a one-shot multivibrator 23. The multivibrator 23 is provided with a timing resistor 24 and capacitor 25 which establish the width of an output pulse applied by the multivibrator 23 to an output 26, such as one millisecond. The output 26 is connected to reset the peak detector 14. The threshold level detector output 20 also triggers a one-multivibrator 27. The multivibrator 27 is provided with a capacitor 28 and a series fixed resistor 29 and variable resistor 30 which establish the length of a negative output pulse applied by the multivibrator 27 to an output 31. The output 31 is connected through a diode 32 to an update line 33 and also to the trigger input of the multivibrator 23. As a consequence, the pulse on the threshold level detector output 20 simultaneously triggers both multivibrators 23 and 27. The multivibrator 27 is designed to have an adjustable time interval which is controlled by the variable resistor 30 and may, for example, vary from 5 to 225 milliseconds.

Once the threshold level detector output 20 triggers the multivibrator 23 to reset the peak detector 14, the multivibrator 27 maintains a negative signal on the trigger input to the multivibrator 23 for the preset time interval established by the variable resistor 30. As a consequence, the multivibrator 23 will generate only a single output pulse for resetting the peak detector 14 until the timing of the multivibrator 27 has elapsed. When the timing of the multivibrator 27 elapses, a signal also applied on the update line 33 causes the force signal stored in the display and alarm circuit 17 to be updated with the current data from the peak detector 14.

Figure 3:
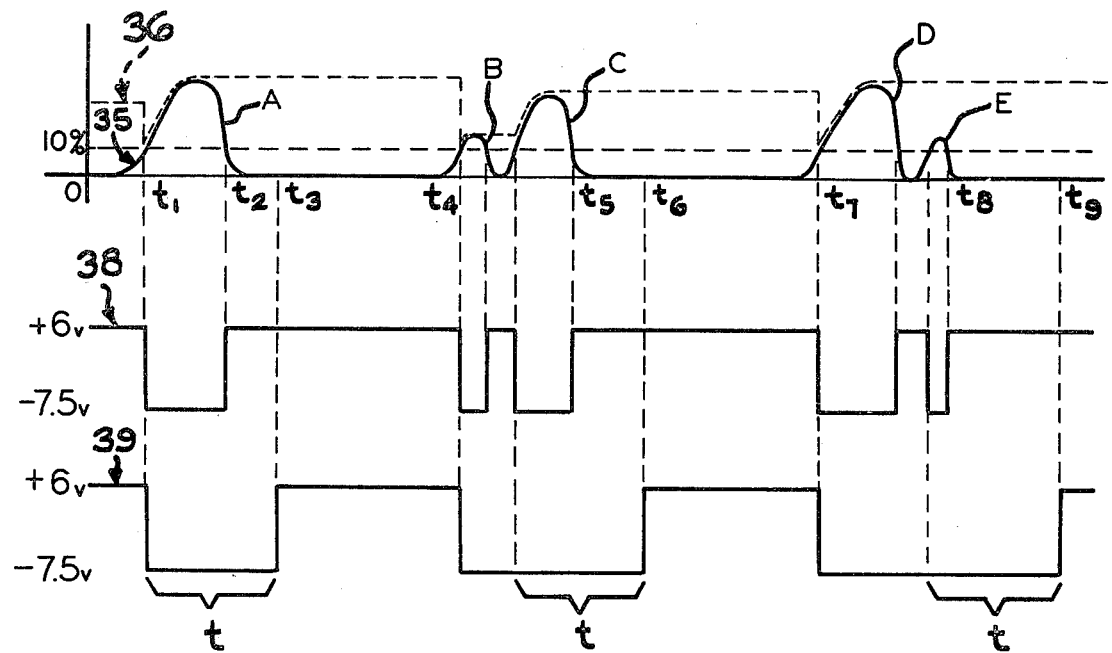
FIG. 3 is a graph illustrating the operation of the threshold level detector and the threshold delay circuit shown in FIGS. 1 and 2.

Turning now to FIG. 3, a graph is provided illustrating the operation of the press cycle monitor 10 under different conditions. The graph of FIG. 3 is provided with 4 curves: a curve 35 illustrating exemplary outputs 13 from the load sensor 11 and auto-zero circuit 12, a superimposed curve 36 illustrating the signal stored in and applied to an output 37 of the peak detector circuit 14, a curve 38 illustrating the output 20 from the threshold level detector 15 and a curve 39 illustrating the update output 33 from the threshold delay circuit 16. The curve 35 illustrates three different typical outputs 13 from the load cell sensor 11 and the auto-zero circuit 12. During a press cycle, a single lobe A may be produced as the press closes and opens. The lobe A crosses a threshold level, illustrated as 10% of the maximum output of the press, at time $t_1$ and remains above the threshold level until a time $t_2$. In another press cycle, a small lobe B crosses above the threshold level at a time $t_4$, drops below the threshold level and subsequently a larger lobe C recrosses above the threshold level and remains above the threshold level until a time $t_5$. Depending upon the nature of the press, there may be one or more smaller lobes B before the highest lobe C. In a third situation, a lobe D crosses above the threshold level at a time $t_7$ reaches a high level and drops momentarily below the threshold level to be followed by a smaller lobe E which finally drops below the threshold level at a time $t_8$. The lobe D may be followed by one or more of the smaller lobes E. Or, the highest lobe may be preceded by and followed by smaller lobes oscillating above and below the threshold level. This may occur, for example, from the dies bouncing slightly as they are closed, or the different height lobes may result from the press performing different operations as they are closed during the cycle. For example, a press may close two dies on a sheet of metal, initially cutting the metal to cause a first pressure lobe and subsequently, as the dies are further closed, shaping the cut piece of metal into a finished product.

It will be noted from the curve 38, that the output 20 from the threshold level detector 15 normally has a high logic level and drops to a low logic level each time the lobes A, B, C, D and E of the curve 35 pass above the threshold level. As illustrated by the curve 39, the update output 33 from the threshold delay circuit 16 normally has a high logic level and drops to a low logic level at times $t_1$, $t_4$, $t_7$, or the first time in each cycle which the load or force of the press crosses above the threshold level. This output is maintained at the low logic level until the multivibrator 27 times out at some preselected time t longer than the last crossing through the threshold point in each cycle. The curve 39 then returns to its normally high level, as illustrated at time $t_3$ in the first cycle following the pulse A, at time $t_6$ in the second cycle following the pulses B and C and at time $t_9$ in the third cycle following the pulses D and E. Each time the curve 39 drops from the high logic level to the low logic level upon the first crossing of the threshold level in a cycle, the peak detector 14 is reset. When the multivibrator 27 times out and the curve 39 returns to the high logic level after the last pulse in each cycle, the update output 33 updates the data stored in the display and alarm circuit 17 with the current output from the peak detector 14. As illustrated by the curve 36, this output will always be at a maximum level when updating takes place.

The diode 22 and the resistor 21 permit the multivibrator 27 to be retriggered by the next negative excursion of the curve 38 if the time t has not elapsed. In other words, the multivibrator 7 is retriggered when the lobe C crosses the threshold level since the time t did not elapse from when the lobe B first crossed the threshold level. This retriggering reduces the time delay t required to inhibit a second reset output 26 from the multivibrator 23 during a cycle. Omitting the resistor 21 and the diode 22 will prevent retriggering and make a longer time delay t necessary. The shorter delay resulting from the retriggering is less critical to set than the longer delay required when retriggering is not provided.

It will be noted that the variable resistor 30 must be set to establish a timing for the multivibrator 27 between the last downwardly crossing of the threshold level in a cycle and the first upwardly crossing in the next cycle. If the time delay is set too short, no error will occur unless there is a crossing of the threshold level in a cycle after the time delay has run out. If the multivibrator 27 times out before the completion of the lobe E of the curve 35, for example, the peak detector 14 will be reset and will store a signal corresponding to the peak of lobe E rather than the peak of lobe D. However, if the timing of the multivibrator 27 is set too long, the peak detector 14 may be reset either during of after a subsequent cycle. For example, if the time $t_6$ does not occur until after the lobe D, the peak detector 14 may be reset and may read the lobe E in the third cycle, thereby indicating an incorrect output force on the press. Therefore, care must be taken in setting the delay of the timer 27 in the threshold delay circuit 16. It also should be appreciated that the timer 27 may require resetting if the speed of the press changes significantly to prevent an erroneous indication of the operation of the press.

Figure 4:
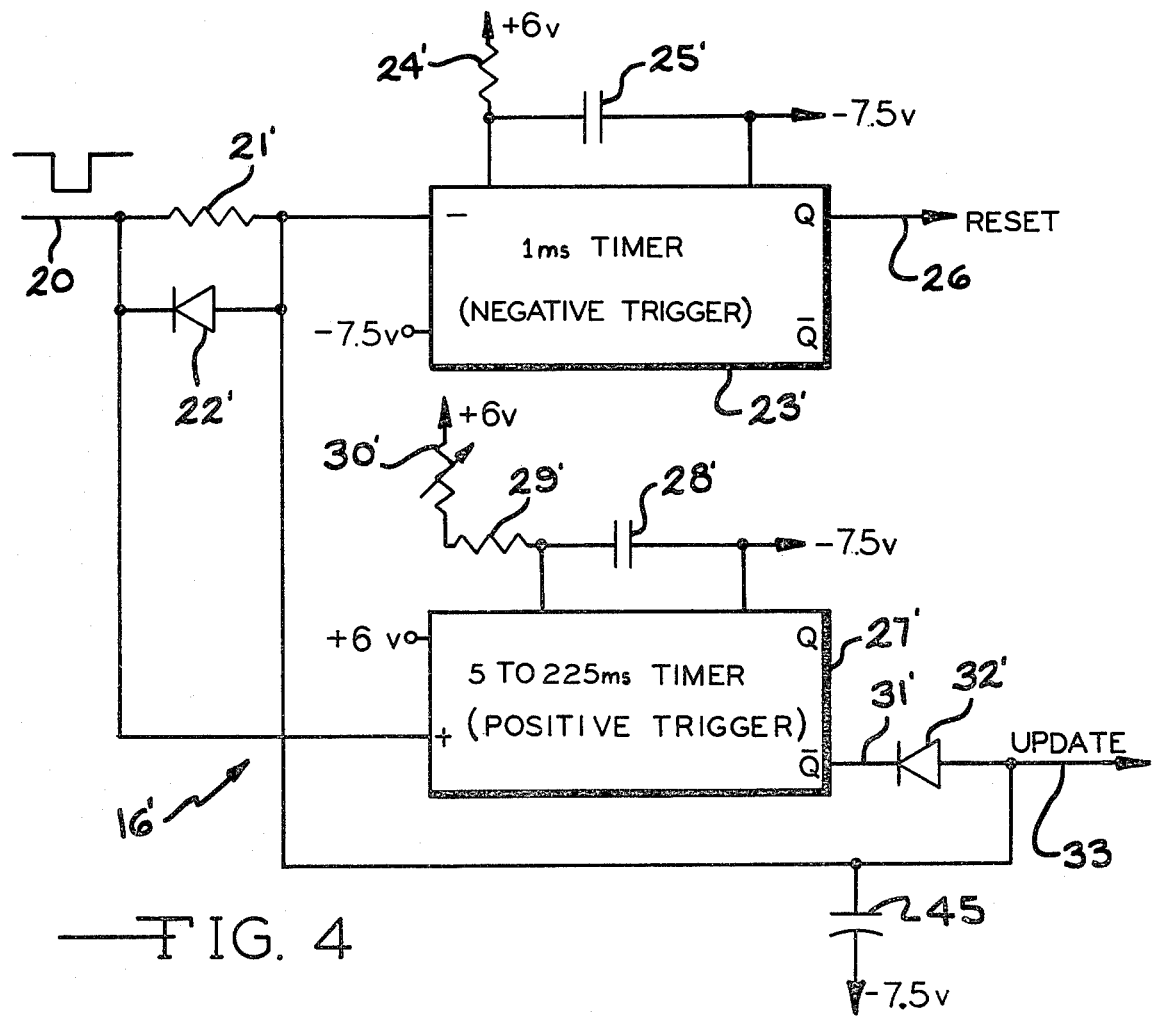
FIG. 4 is a modified embodiment of a threshold delay circuit for use in the press cycle monitor illustrated in FIG. 1.

Turning now to FIG. 4, a modified embodiment of a threshold delay circuit 16' is illustrated. The threshold delay circuit 16' of FIG. 4 is similar to the threshold delay circuit 16 of FIG. 2, except that the time delay is measured from the last downwardly or decreasing crossing of the threshold level rather than the first upwardly or increasing crossing. The threshold delay circuits 16' is similar to the circuit 16 and similar components are labeled with the prime of the same number. The threshold level detector output 20 is applied through the parallel resistor 21' and diode 22' to trigger the multivibrator 23' for generating a reset pulse on an output 26 to reset the peak detector 14. The reset pulse is of a short duration, such as one millisecond, and is established by a resistor 24' and a capacitor 25'. The threshold level detector output 20 also is applied to a positive trigger input of the variable time one-shot multivibrator 27'. The multivibrator 27' applies a signal on an output 31' having a predetermined pulse width established by the capacitor 28', the fixed resistor 29' and the variable resistor 30'. The pulse on the output 30' is applied through the diode 32' to the update 33 for transferring data to the display and alarm circuit 17 and also from the diode 32' to the trigger input of the timer 23'. In addition, a capacitor 45 is provided between the output of the diode 32' and the trigger input of the multivibrator 23'.

In operation, the threshold level detector output 20 triggers the timer multivibrator 23' to apply a reset signal on the output 26 when the output from the load sensor 11 and auto-zero circuit 12 first crosses the threshold level in a cycle. The threshold level detector output 20 also charges the capacitor 45 through the diode 22'. When the press load drops below the threshold level, the change in the level of the threshold level detector output 20 triggers the multivibrator 27'. The charge on the capacitor 45 prevents the trigger input to the multivibrator 23' from raising to a positive voltage level until the negative output pulse from the timer 27' is applied to the trigger input of the multivibrator 23'. Therefore, the trigger input to the multivibrator 23' is maintained negative and no new reset pulse can be generated by the multivibrator 23' until the multivibrator 27' has timed out. The multivibrator 27' will not time out until after the last of the series of pulses in a cycle has dropped below the threshold level and the time period set by the variable resistor 30' has elapsed.

Figure 5:
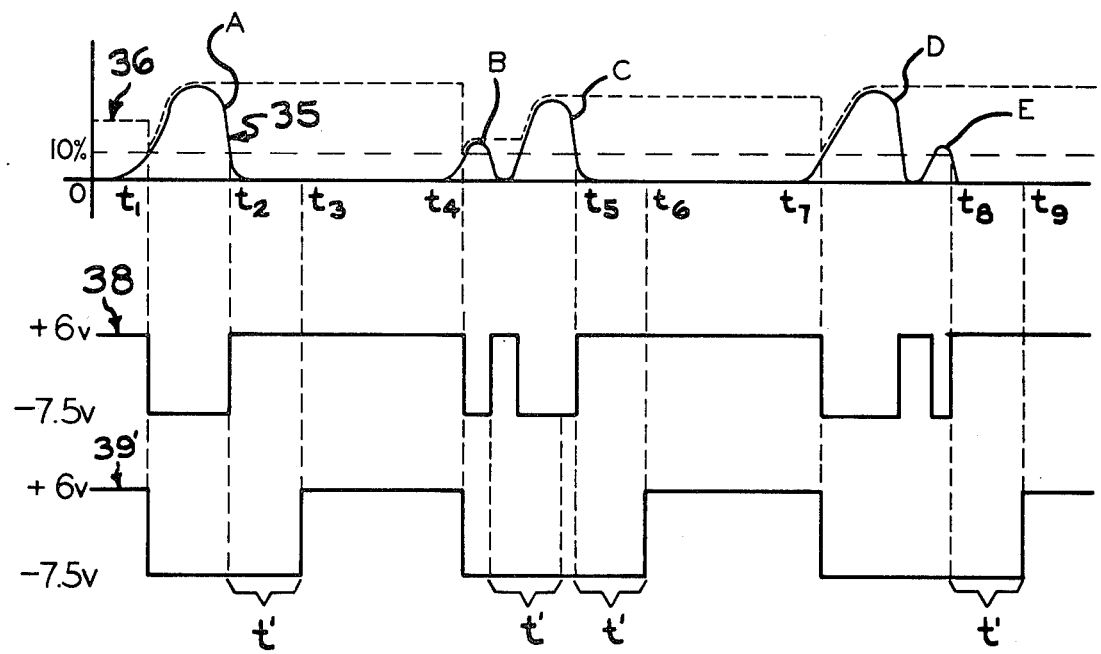
FIG. 5 is a graph showing the operation of the threshold level detector and the threshold delay circuit of FIGS. 1 and 4.

Operation of the threshold delay circuit 16' for different output 20 from the threshold level detector 15 will be understood better by referring to FIG. 5, wherein, a graph is shown similar to that of FIG. 3 for the outputs from the auto-zero circuit 12, the peak detector 14, the threshold level detector 15 and the threshold delay circuit 16. The curve 35 illustrated as an exemplary output 13 from the auto-zero circuit 12 and load cell array 11, the output 36 from the peak detector 14 and the output signal 38 from the threshold level detector 15 are identical to the corresponding curves shown in FIG. 3. The only difference is in the output curve 39' for the update output 33 from the threshold delay circuit 16'. It will be noted that the curve 39' normally has a high logic level and drops to a low logic level at the beginning of each press cycle when the threshold level is first crossed by the output 35 from the auto-zero circuit 12. At this time, the curve 39' drops to a low logic level. The low logic level is maintained to the last downwardly or decreasing crossing of the threshold level in a press cycle then for an additional time t'. As a consequence, the curve 39' will have low logic level for a time period which varies in each cycle with the total length of time in the cycle in which the press output is above the threshold plus the time increment t' required to time out the timer 27'. When multiple lobes are present such as is illustrated in the second and third machine cycles in the curve 35, the timer 27' starts timing for the time increment t' on each downward crossing through the threshold level. The time increment t' must be set longer than the time between the last or downward threshold crossing of the lobe B and the first or upward threshold crossing of the lobe C and the corresponding time spacing between the lobes D and E. In the event that the next two threshold crossings occur before the time increment t' expires, the multivibrator 27' is retriggered and the full time increment t' starts over from the last positive excursion of the curve 38. As the press speed increases, it should be noted that the time above the threshold level will decrease so that the time in which the curve 39' is at a low logic level also decreases. In other words, a time difference between the times $t_2$ and $t_1$ for lobe A in the first press cycle, the time difference between the items $t_5$ and $t_4$ for the lobes B and C in the second press cycle and the time difference between the times $t_8$ and $t_7$ for the lobes D and E in the third press cycle will decrease as the press operating speed increases. This permits the press cycle monitor 10 using the threshold delay circuit 16' to operate with a press having a much wider range of speeds without the necessity of adjusting the variable resistor 30' over a similar circuit incorporating the threshold delay circuit 16 shown in FIG. 2, since the duration of the lobe need not be included in the time t'.

Figure 6:
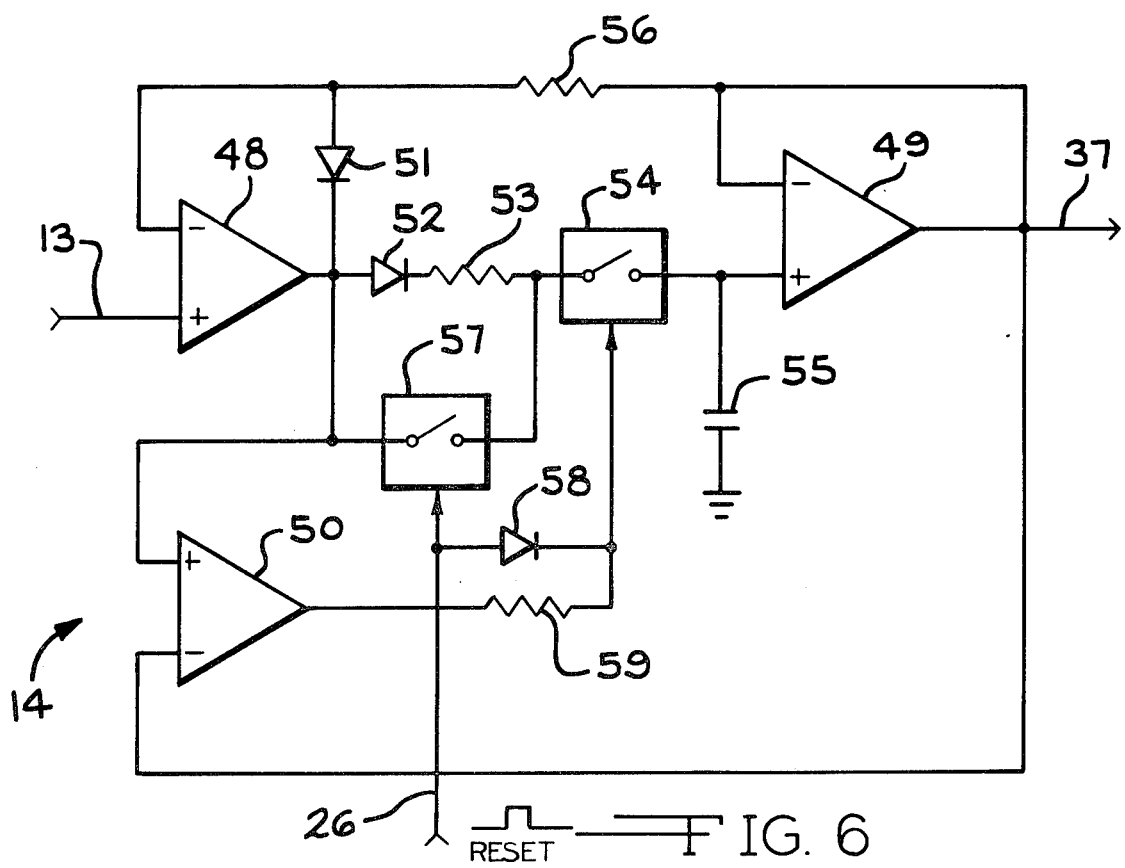
FIG. 6 is a schematic circuit diagram of a peak detector for use in the press cycle monitor of FIG. 1.

Turning now to FIG. 6, an exemplary peak detector circuit 14 is illustrated. The peak circuit 14 includes two operational amplifiers 48 and 49 and a comparator 50. The output 13 from the auto-zero circuit 12 and load cell array 11 is applied to the non-inverting input of the amplifier 48. A diode 51 is connected in a feedback path between the output of the amplifier 48 and its inverting or negative input. The output of the amplifier 48 is further connected through a series diode 52, resistor 53 and the controlled terminals of an electronic switch 54 to the non-inverting input of the amplifier 49. The non-inverting input of the amplifier 49 also is connected through a capacitor 55 to ground. A direct connection is made between the output and the inverting input of the amplifier 49 so that the amplifier 49 functions as a voltage follower. The output of the amplifier 49 forms the output 37 from the peak detector 14. A resistor 56 also is connected between the inverting inputs of the amplifiers 48 and 49. A second electronic switch 57 is provided with controlled terminals connected in parallel with the series diode 52 and resistor 53. The switch 57 is controlled or closed automatically in response to a reset pulse on the reset line 26 from the threshold delay circuit 16. The reset line 26 also is connected through a diode 58 to the control terminal for the switch 54 to simultaneously close the switch 54 and the switch 57. Finally, the outputs from the operational amplifiers 48 and 49 are connected to the two inputs of the comparator 50. The comparator 50 has an output applied through a resistor 59 to the control terminal of the switch 54. Whenever the output of the amplifier 48 is greater than the output of the amplifier 49, the comparator 50 generates a signal of the same polarity as a reset pulse for closing the switch 54.

In operation, assuming the peak detector 14 previously has been reset by a pulse on the line 26, the amplifier 48 will generate an output signal in response to the press load signal on the line 13. This output signal is applied to the comparator 50 and also through the diode 52 and resistor 53 to the switch 54. Assuming as we indicated above that the peak detector 14 had previously been reset, the capacitor 55 will be discharged and the amplifier 49 will have no output. Since the output of the amplifier 48 is greater than the output of the amplifier 49, the comparator 50 will close the switch 54 and the capacitor 55 will charge toward a voltage equal to the voltage at the output of the amplifier 48 which is near its positive saturation level. Charging of the capacitor 55 will continue until the output of the amplifier 49, which is proportional to the voltage on the capacitor 55, compares with the signal on the line 13 applied to the non-inverting input of the amplifier 48, at which time the output of the amplifier 48 abruptly switches in a negative direction, the diode 52 becomes reverse biased, and the comparator 50 opens the switch 54. The output 37 therefore is equal to the input 13 since the amplifier 48 is selected for a low offset voltage between the two inputs. The feedback path through the resistor 56 assures that the output 37 is equal to the peak signal on the input 13. The charge on the capacitor 55 maintains the output of the amplifier 49, unless the voltage on the input 13 should further increase. If the voltage on the input 13 drops below a previous peak, the switch 54 is maintained open by the comparator 50 and no further change will take place in the output 37 from the peak detector 14. When a reset pulse is subsequently applied to the reset input 26, the switches 54 and 57 are closed. The input 13 at this time will be low, near the threshold level, so that the amplifier 48 will have a low level output. This output is applied directly through the closed switches 57 and 54 to discharge the capacitor 55. When the switches 54 and 57 are both closed, the circuit is linear and the output 37 assumes the same level as the line 13 by virtue of the feedback through the resistor 56. Since the amplifier 49 is a voltage follower, the voltage on the capacitor 55 will be approximately equal to the output 37 which is equal to the voltage on the line 13. This will be the threshold voltage at the reset time. When the reset pulse on the line 26 ends, the switches 54 and 57 are open. As the press load or force signal on the line 13 subsequently increases during the next press cycle, the comparator 50 will close the switch 54 to again charge the capacitor 55 to a peak voltage proportional to the peak force exerted by the press.

It should be appreciated from the above description that the peak detector 14 will be reset at a point in each press cycle before the peak load exerted by the press is reached. This is achieved by delaying a predetermined time interval after each press cycle and then permitting the peak detector 14 to reset the next time the load on the press passes through a predetermined threshold level. The threshold level may set at any arbitrary point, such as 10% or 25%, for example, of the maximum load or force which may be exerted by the press.

It will be appreciated that various changes and modifications may be made in the above described press cycle monitor without departing from the spirit and the scope of the following claims.

What I claim is:

1. A cycle monitor for measuring the peak force exerted by a machine in each of a series of operating cycles comprising means for generating a first analog signal having a magnitude proportional to the force exerted by the machine, resettable peak detector means responsive to such first signal for establishing a second signal having a magnitude proportional to the highest magnitude of such first signal occurring after said peak detector means is reset, the highest magnitude of such second signal being a measure of the peak force exerted by the machine in an operating cycle, means for detecting when such first signal initially exceeds a predetermined low threshold level in each machine operating cycle, and means responsive to said detecting means for resetting said peak detector means to establish such second signal at a low magnitude in preparation for establishing a new peak second signal for the current machine cycle.

2. A machine cycle monitor, as set forth in claim 1, wherein said detecting means has an output at a first level whenever such first signal is below said threshold level and at a second level whenever said first signal is above said threshold level, and wherein said resetting means resets said peak detector means in response to the output of said detecting means first changing from said first level to said second level in each machine cycle.

3. A machine cycle monitor, as set forth in claim 2, wherein said resetting means includes delay means for inhibiting resetting of said peak detector means more than once in each machine cycle.

4. A machine cycle monitor as set forth in claim 3, wherein said delay means measures a predetermined time delay from the first time in each machine cycle the output of said detecting means changes from said first level to said second level.

5. A machine cycle monitor, as set forth in claim 3, wherein said delay means measures a predetermined time delay from the last time in each machine cycle the output of said detecting means changes from said second level to said first level.

6. A machine cycle monitor, as set forth in claim 1, wherein said resettable peak detector means includes first amplifier means having an output responsive to such first signal, a capacitor, second amplifier means having an output proportional to the charge on said capacitor, said second amplifier output forming such second signal, and means comparing said first and second amplifier outputs for charging said capacitor with said first amplifier output whenever said first amplifier output exceeds said second amplifier output, and wherein said resetting means includes means for discharging said capacitor.

7. A cycle monitor for measuring the peak force exerted by a machine in each of a series of operating cycles comprising means for generating a first analog signal having a magnitude proportional to the force exerted by the machine, resettable peak detector means responsive to the magnitude of such first signal for establishing a second signal proportional to the highest magnitude of such first signal after said peak detector means is reset, such second signal being a measure of the peak force exerted by the machine in each operating cycle, means for detecting when such first signal initially exceeds a predetermined low threshold level in each machine operating cycle, and means responsive to said detecting means for resetting said peak detector means to establish such second signal at a low magnitude proportional to the magnitude of such first signal at the time said peak detector means is reset.

8. A machine cycle monitor, as set forth in claim 7, wherein said detecting means has an output at a first level whenever such first signal is below said threshold level and at a second level whenever said first signal is above said threshold level, and wherein said resetting means resets said peak detector means in response to the output of said detecting means first changing from said first level to said second level in each machine cycle.

9. A machine cycle monitor, as set forth in claim 8, wherein said resetting means includes delay means for inhibiting resetting of said peak detector means more than once in each machine cycle.

10. A machine cycle monitor as set forth in claim 9, wherein said delay means measures a predetermined time delay from the first time in each machine cycle the output of said detecting means changes from said first level to said second level.

11. A machine cycle monitor, as set forth in claim 9, wherein said delay means measures a predetermined time delay from the last time in each machine cycle the output of said detecting means changes from said second level to said first level.

12. A machine cycle monitor, as set forth in claim 7, wherein said resettable peak detector means includes first amplifier means having an output responsive to such first signal, a capacitor, second amplifier means having an output proportional to the charge on said capacitor, said second amplifier output forming such second signal, and means comparing said first and second amplifier outputs for charging said capacitor with said first amplifier output whenever said first amplifier output exceeds said second amplifier output, and wherein said resetting means includes means for discharging said capacitor.

* * * * *